(12) United States Patent  (10) Patent No.: US 7,948,203 B2
Siemes  (45) Date of Patent: May 24, 2011

(54) DEVICE FOR THE CONTROL OF A SMOOTH STARTING OR ENDING OF A THREE PHASE CURRENT MOTOR, SO-CALLED SOFT STARTER

(76) Inventor: Andreas Siemes, Issum (DE)

( * ) Notice: Subject to any disclaimer, the term of this patent is extended or adjusted under 35 U.S.C. 154(b) by 502 days.

(21) Appl. No.: 12/214,847

(22) Filed: Jun. 23, 2008

(65) Prior Publication Data

US 2009/0015190 A1 Jan. 15, 2009

(30) Foreign Application Priority Data

Jun. 29, 2007 (DE) .......................... 10 2007 030 344

(51) Int. Cl.
*H02P 1/16* (2006.01)

(52) U.S. Cl. ............................... 318/778; 318/8; 318/11

(58) Field of Classification Search .................. 318/778, 318/8, 11, 805, 812, 767, 494, 801, 729, 318/809, 400.22

See application file for complete search history.

(56) References Cited

U.S. PATENT DOCUMENTS 4,638,226 A * 1/1987 Damiano et al. .............. 318/246
6,208,111 B1 3/2001 Williams

FOREIGN PATENT DOCUMENTS

| DE | 91116635 | 1/1992 |
|----|----------|--------|
| DE | 10301270 | 7/2003 |
| JP | 2004357348 | 12/2004 |
| WO | 2006034977 | 4/2006 |

* cited by examiner

*Primary Examiner* — Karen Masih
(74) *Attorney, Agent, or Firm* — Horst M. Kasper

(57) ABSTRACT

An arrangement for the control of a soft starting or stopping of a three phase current motors (1), a so-called soft starter, is furnished for starting of heavy mechanical, electrical, or hydraulic drives. In order to obtain a space savings with individual or multiple installation and to obtain a better accessibility during servicing, at least one switch cell (3) is formed in a switching cabinet (2), wherein the switch cell (3) comprises at least a three phase power block (4), and the power electronic (5) as well as contactors (6, 18) and is as a unit towards the front easily demountable or inversely incorporatable and is arranged without attachment at the rear or side wall (8) of the switch cabinet (2). In addition, it is furnished that in contrast a separating switch (9) attached at the switch cabinet wall (2) with a collection rail connection (10) by way of a pluggable contact coupling (10*a*) is connectable upon shifting inside and disengageable upon pulling out.

14 Claims, 6 Drawing Sheets

(EMBODIMENT "A" AND
EMBODIMENT "B")

(EMBODIMENT "A" AND EMBODIMENT "B")

(EMBODIMENT "C")

DEVICE FOR THE CONTROL OF A SMOOTH STARTING OR ENDING OF A THREE PHASE CURRENT MOTOR, SO-CALLED SOFT STARTER

The invention relates to a device for the control of a smooth starting or ending of three phase current motors (so-called soft starter) which are pre-connected for the starting of heavy mechanical, or electrical, or hydraulic drives, wherein individual device groups of a power block with thyristors, a power electronic as well as with contactors collected in a switch cabinet.

Such installations work in the power region of about 0.5 kW, in particular 200 kW to about 25,000 kW and rated voltages up to about 17.5 kV and currents up to about 1250 Ampere.

The construction of such installations as a switch cabinet is known from a flyer of the company Siemens Corp. "soft starter", in particular on page 3. The disadvantages of this construction comprise however the arrangement of one or several switch cabinets in a row and in the formation in the interior of the individual switch cabinet. Thus the power electronic L1, L2, and L3 is rigidly attached at the rear wall in the known switch cabinet. The power unit comprises a block of thyristors with intermediately disposed cooling bodies, a protective circuit and an electronic control for the thyristors for each phase. In view of the attachment of such a power electronic at the rear wall, the connections for the main current (the power) are performed only from above or from below or from above and from below. In practical situations there results a minimum distance (of about 120 mm) depending on the voltage level. Such switch cabinets can only be installed individually. A row made out of these switch cabinets would cover disadvantageously a large space, which space could otherwise not be used. Such switch cabinets can only be installed individually. A row of next to each other installed switch cabinets would claim disadvantageously a large room. An enormous space requirement for the further required construction parts and construction groups of the current circuit of the soft starter would follow.

The mode of operation of such a soft starter is also known from the international Patent publication WO 2006/034977 A1. Reference is made to the description provided there.

It is an object of the invention to arrange essential construction parts and construction groups such as the grid contactor, the power electronics L1, L2, and L3 as well as the bridge over contactor both for a single installation as well as a row installation of the switch cabinets or, respectively, of the switch cells of different power stages with an improved space subdivision under consideration of special service conditions.

Figure 1A:
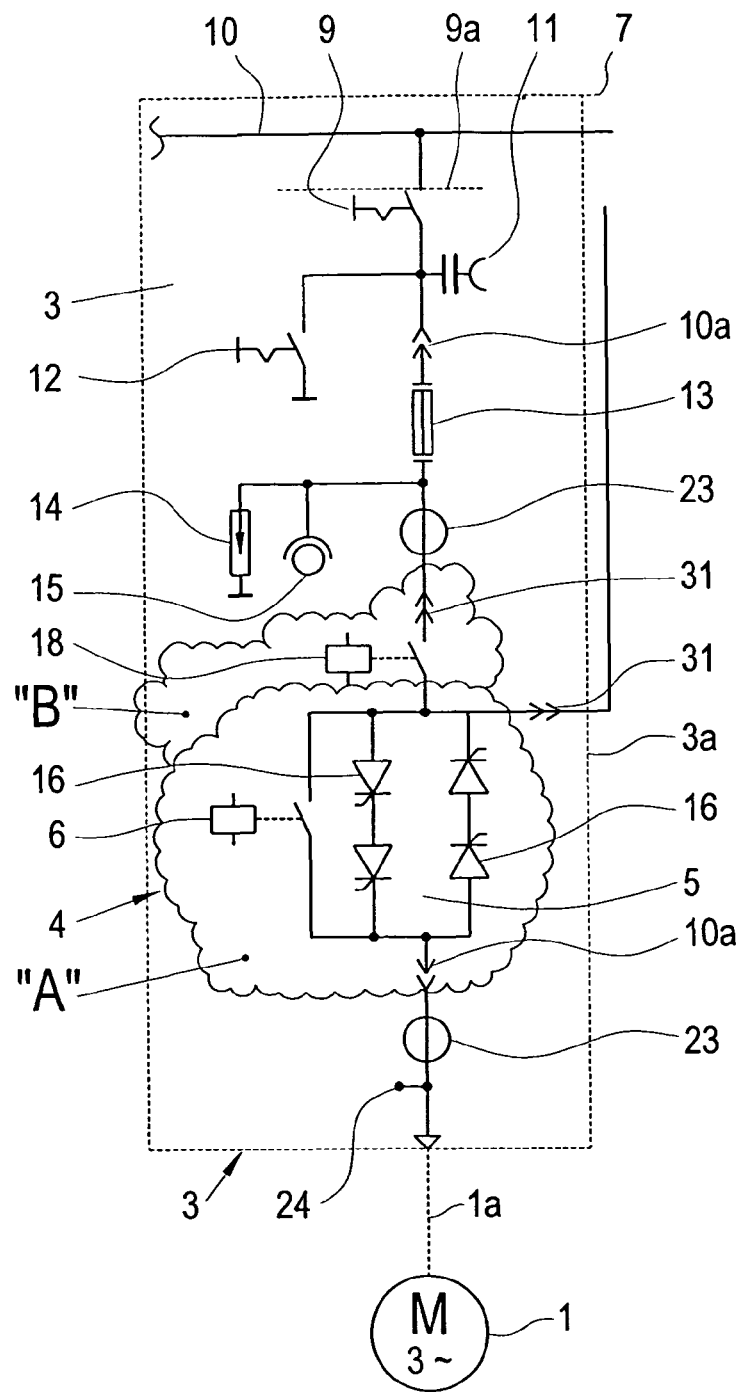

The object set out is resolved according to the present invention by forming at least one switch cell in a switch cabinet, wherein the switch cell comprises at least the three phase power block, the associated power electronic as well as the required contactors and is arranged in a frame with surrounding switch cell walls and an attachment of support insulators running in construction direction and as a unit easily disengage able toward the front and inversely mountable and disposed without attachment at a rear wall or side wall of the switch cabinet and that on the contrary a separating switch attached at the switch cabinet wall and with a collection rail connection by way of a pluggable contact coupling during insertion is connectable or is disengageable during driving out (embodiment "A"/FIG. 1A). The advantages include an easy and safe servicing possibility outside of the switch cabinet and a more favorable space subdivision as far as the width of this switch cabinet is overall reduced and therefore a lesser width at an individual switch cabinet and with the number of switch cabinets placed next to each other generating an increasing gain of space. The power block (for each phase) with the associated device elements is therefore collected or, respectively, arranged without attachment at the rear wall or the side walls of the switch cabinet. In comparison with the conventionally known embodiment, this capturing of the device components to a power block is only possible where the power electronic as is known with the rear wall constructively carrying the power electronic is not incorporated to the switch cabinet rear wall. With the power block, on which invention is based, the three power electronics (one piece for each phase) in insulating bodies are rotated by 180 degrees as compared to the known construction fashion, in each case with the supporting glass fiber reinforced rear wall toward the switch cabinet front, built into the frame and attached at a traverse. With such an incorporation position of the power electronic in the power block, one or several connections carrying the main current can be led to the carrying glass fiber reinforced back walls from the power electronic or passing above and below at the rear wall to the bridged over contactor disposed in front or, respectively, to a main contactor. In order to reach the motor connection from the bridged over contactor with the conductors leading the main current or, respectively, copper current rails, the use of an aluminum cooling body as a conducting connection member is advantageous in the power electronic. The known switch cabinets can be constructed up to 50 percent narrower according to the present invention.

It is furnished as a feature that within the frame of the switch cell additionally a main contactor and a disengageable contact screw connection are furnished (embodiment "B"/FIG. 1A). An expanded construction unit is reached thereby without changing the outer dimensions, that is only a minimum space is required.

Figure 1B:
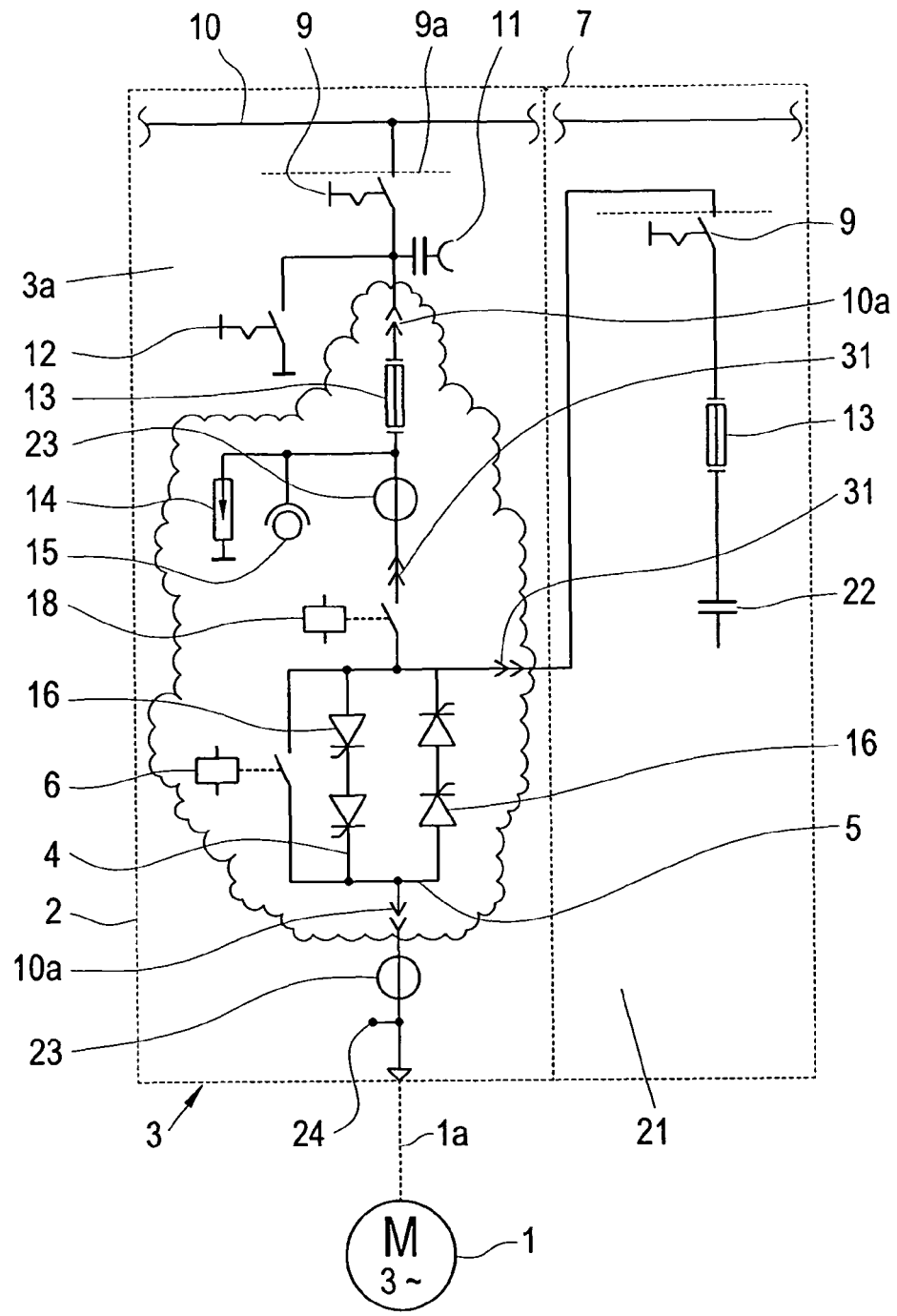

A still larger feature, also without outer changes, is generated according to a further feature by having arranged in the frame of the switch cell additionally single or double fuses, over voltage charge eliminators and voltage sensors and/or current sensors and that in each case one collection rail connection attached to the switch cabinet wall is connectable or disengageable by way of a second pluggable contact coupling (embodiment "C"/FIG. 1B).

The incorporation or disassembly of the switch cell is particularly simple and in a short time to be effected, if according to further features at least the power electronic is disposed in a carriage insertable and withdrawable from the switch cabinet and in such case the power block is maintained by the fixed location.

The complete switch cell can however also be serviced easily accessible from all sides, if in addition to the power electronic also the power block is disposed in operating distance on the carriage.

It is a further advantage that at least one rear wall for the power electronic on the carriage is formed of a glass fiber reinforced plastic.

Further protective measures for the arrangement of the power electronic and the power block comprise that a closed, insulated is formed for each phase in the carriage frame for the power block and for the power electronic and that the current rail for the connection of the external motor lines runs outside of this casing and is attached with support insulators at the rear switch cabinet wall.

An improvement further comprises that for each phase a double fuse is connected between a removable insulating material plate and open contacts of the separating switch and a successive grid contactor.

In addition, it is furnished that a ground bolt is connected in front of the output of the three phase line out of the insulated casing.

According to other features it is proposed that the power block is connected in the lower region with the bridge over contactor and in the upper region with the contactor.

A disengageable contact screw connection for a capacitor is furnished at the power block for an extended embodiment.

Another further development comprises that the bridge over contactor is connected in each case with the electrical main current carrying copper current rails in the power block at aluminum cooling bodies of the power electronic, which aluminum cooling bodies are connectable with the current rail for the motor connection through the contact coupling. Different embodiments of the switch cells can thereby easily considered.

The invention concerns in addition safety aspects during the operation of the installation and further forms the operation by having the separating switch with a shaft and the ground switch also with a shaft actuable from the outside at the switch cabinet.

Extraordinarily important features result further from the situation that with open separating switch and with closed ground switch and with inserted insulating material plate the door of the middle voltage chamber can be opened. This furnishes an absolute contact safety for the operator, wherein the contact safety corresponds to the relevant regulations of the electrical technology.

Embodiment examples of the invention are illustrated in the drawing, where the embodiment examples are illustrated in more detail in the following.

Figure 2:
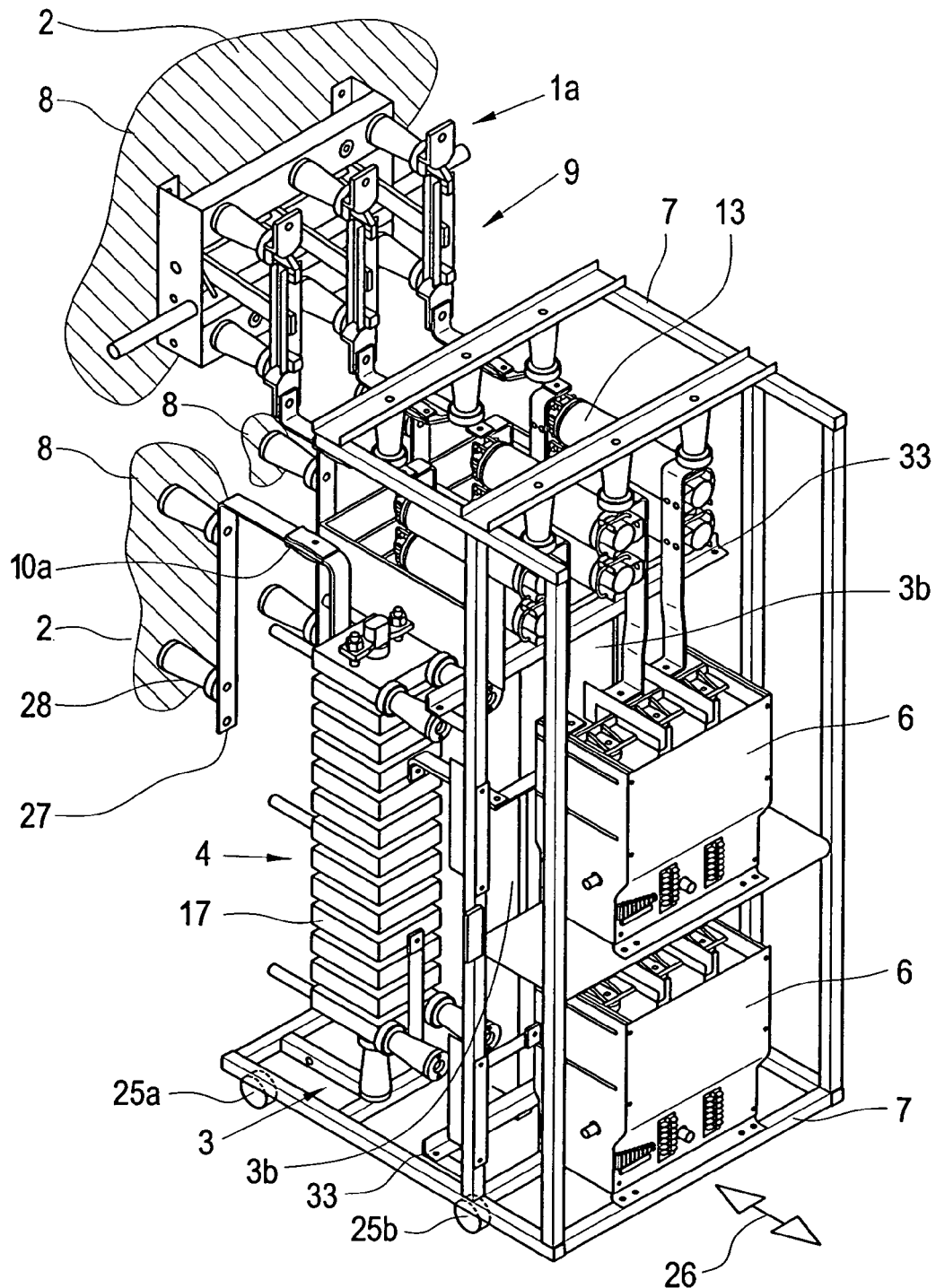
Figure 3:
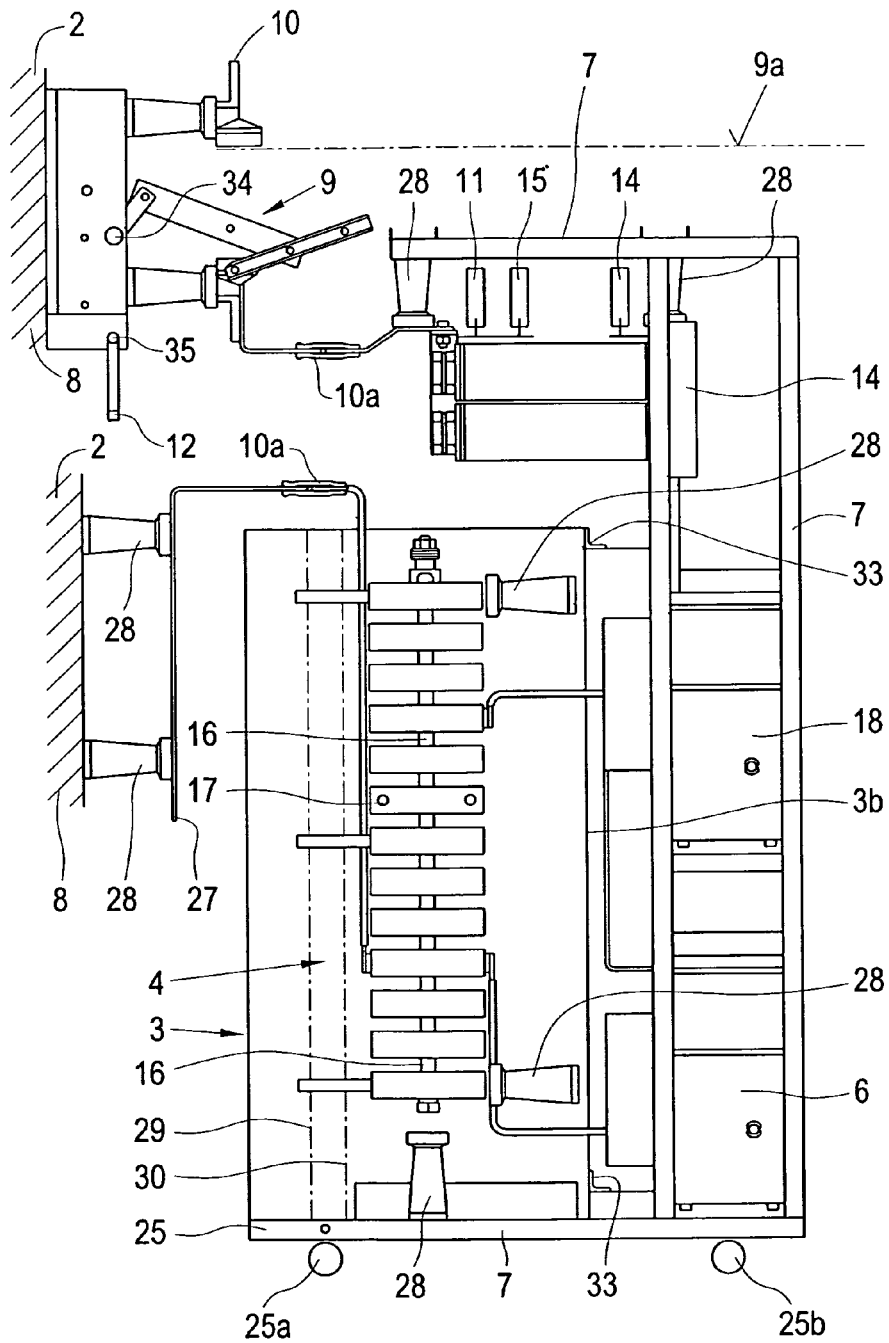
Figure 4:
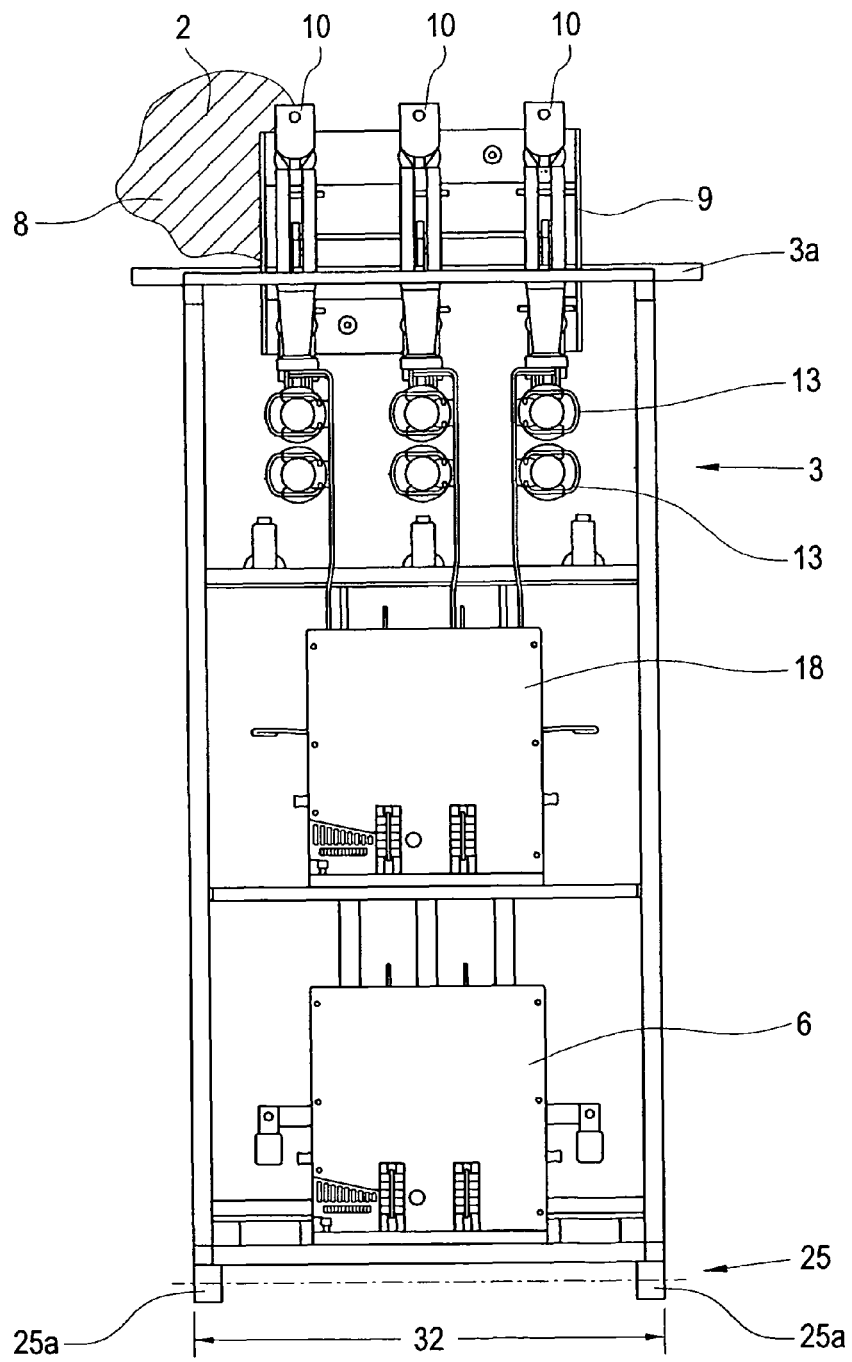
Figure 5:
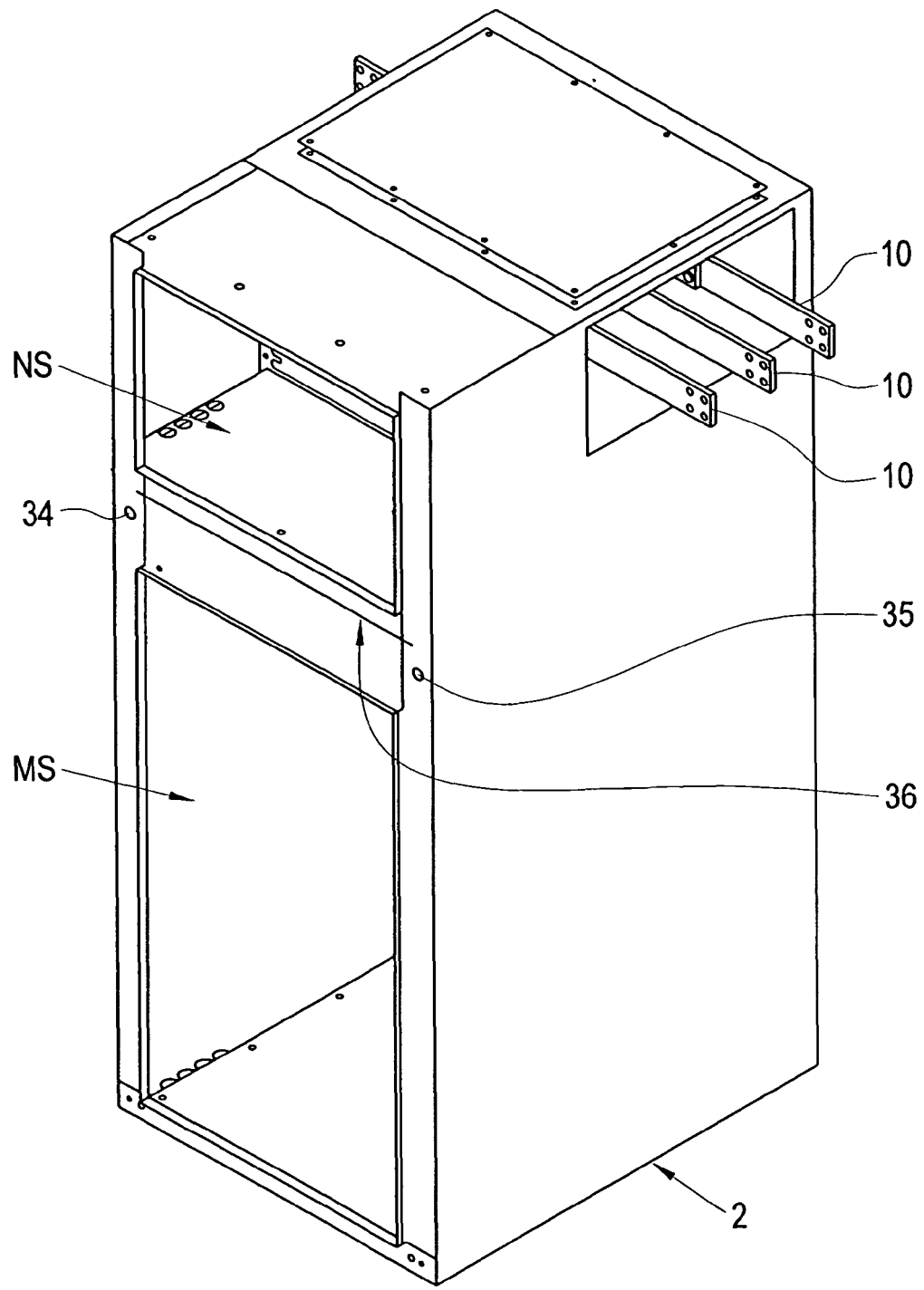

There is shown in:

FIG. 1A an electrical basic circuit with the essential device groups of the invention for the embodiments "A" and "B", FIG. 1B a modification of the embodiment on which FIG. 1A is based, designated as embodiment "C", FIG. 2 a prospective view of the dismountable or mountable unit as well as with the separating switch remaining at the switch cabinet during disassembly and the also remaining motor connection, FIG. 3 a side view in the plane corresponding to FIG. 2, FIG. 4 a front view to the views of FIG. 2 and FIG. 3, and FIG. 5 a perspective view of the switch cabinets or, respectively, the switch cell without course at the front side with the actuating elements and the low voltage chamber or, respectively, middle voltage chamber.

According to FIG. 1A, the to be softly started three phase current motor 1 is connected to a switch cabinet 2 through a corresponding guided three phase line 1a. A switch cell 3 with all the essential device groups, namely a (still to be explained) power block 4, comprising several power electronics 5, an electronic control 29 and the protective circuit 30 (FIG. 3) for thyristors 16 as well as the bridge over contactor 6 is formed in the switch cabinet 2, which switch cell 3 exhibits a frame 7 openly accessible after demounting. The frame 7 has function technically a rear or side wall 8 (FIG. 2). The current circuit can be grounded with a ground switch 12. An insulating material plate 9a is inserted through the slot 36 (FIG. 3) from the outside between the open contacts of the separating switch 9. The electrical elements can be switched off by hand from the outside or can be switched on with the separating switch 9, which separating switch 9 comprises an insulating material plate 9a (dash-dotted drawn) having the width of the slot 36 (FIG. 3). The electrical elements can be switched off or can be turned on by hand by way of the separating switch 9, which separating switch 9 consists of a (dash-dotted drawn) insulating material plate 9a having the width of the slot 36. The collection rail connection 10 is disposed in the region of the separating switch 9 and thereupon following the capacitive voltage display 11, wherein the capacitive voltage display 11 exhibits a ground connection 12. In addition fuses 13 are furnished. Then an over voltage charge eliminator 14 is following thereto. Voltage sensors 15 are connected to the over voltage charge eliminator 14. The main contactor 18 is connected in front of the power block 4, which power block 4 is formed by the thyristors 16 with intermediately disposed aluminum cooling plate 17 (compare FIGS. 2 through 4). The main contactor 18 is disposed in a capacitor operating field 21 and is protected with double fuses 13 against a capacitor 22. The current sensor 23 is drawn in the switch cell 3 of the variable soft starter in an arrow direction toward the power block 4. The current sensor 23 can also the disposed between the fuses 13 and the main contactor 18. The three phase line 1a is secured by way of a grounding bolt 24 in front of the output.

The embodiment "A" shows in a threefold next to each other arrangement in each case an open casing surrounded on four sides, on top and below open for cooling purposes, made of glass fiber reinforced plastic, which open casing surrounds the following device components: the power electronics 5, the thyristors 16, the electronic control 29 for the thyristors 16, the protective circuit 30 for the thyristors 16, a bridge over contactor 6, a contact coupling 10a and a disengageable contact screw connection 31.

In addition, the FIG. 1A contains the embodiment "B", which embodiment "B" results by adding the main contactor 18 and a disengageable contact screw connection 31.

An alternative embodiment "C" to the embodiment of FIG. 1A is shown in FIG. 1B. This embodiment "C" distinguishes by the extension of construction components, which are disposed within the switch cell 3, and which therefore are incorporated as required and are used with the other components. These components are essentially the double fuses 13, the disengageable contact screw connection 31, or two further contact couplings 10a as well as the over voltage charge eliminator 14 and the voltage sensors 15. The higher disposed device components (for example 11, 12, and so on) are anyway fixed and belong to the device group of the separating switch 9, which is not demountable. This embodiment "C" shows again and in a threefold next to each other arrangement in each case the casing surrounded on four sides and on top and at the bottom open for cooling and made of glass fiber reinforced plastic which surrounds the following device components: the power electronic 5, the thyristors 16, the electronic control 29, the protective circuit 30 for the thyristors 16, the bridge over contactor 6, the contact coupling 10a, and main contactor 18 and a disengageable contact screw connection 31.

The switch cell 3 is formed as the carriage 25 supported by a frame 7 and on wheel pairs 25a, 25b movable out of and into the switch cabinet 2 in arrow directions 26. The separating switch 9 is fixedly disposed at the switch cabinet 24 for the three phase line 1a. The current rail 27 for the motor connection is similarly fixedly and rigidly attached at the switch cabinet 2 by support insulators 28 and in fact on the back wall or side wall 8. Such insulating holders 28 are furnished at the complete switch cell aggregate 3 for attaching of the current lines.

The device groups from FIG. 2 are viewed in the plane from the side in FIG. 3, wherein again the separating switch 9

(with the there not illustrated switch shaft 34 as a hand switch element, which hand switch element is led toward the outside of the switch cabinet 2) attached at the switch cabinet 2, that is at the back wall or side wall 8 of the switch cabinet 2, and the current rail 27 are visible for the connection of the three phase current motor 1 to be started. The separating switch 9 is drawn in open position The frame 7 as a carrier for the proper switch cell 3 is formed as a carriage 25 with the wheel pairs 25a, 25b and by way of the contact couplings 10a in each case can be decoupled both from the current rail 27 as well as also from the separating switch 9 and the carriage 25 is for maintenance moved in front of the switch cabinet 2 and after performed service again led back through the contact couplings 10a again connected. An in each case sideways disposed parallelogram—lever arrangement for swiveling the switch cell 3 out of the switch cabinet 2 and for swiveling back into the switch cabinet 2 can be employed instead of the carriage 25.

Between the thyristors 16 placed in a row there are disposed in each case aluminum cooling plates 17. The electronic control 29 for the thyristors 16 and the protective circuit 30 for the thyristors 16 are furnished in front of the thyristors 16 placed in a row vertically on an axis. The thyristors 16 are disposed inside of the power block 4. The over voltage charge eliminator 14 belongs to the switch cell 3. The collection rail connection 10 is visible for each phase at the separating switch 9. This embodiment "C" is again characterized by the threefold next to each other arrangement of the on four sides surrounding, on top and at the bottom open casing made out of glass fiber reinforced plastic, which casing surrounds the following device components: the power electronics 5, the thyristors 16, the electronic control 29 for the thyristors, the protective circuit 30 for the thyristors, the bridge over contactor 6, the contact coupling 10a, the main contactor 18, the double fuse 13, an over voltage charge eliminator 14, a voltage sensor 15, a (capacitative) voltage display 11, support insulators 28, and a further contact coupling 10a.

The contactor 6, 18 can also be replaced by power switches under maintaining of the spacial arrangement in the power block 4.

FIG. 4 shows the switch cabinet 2 in or opposite (parallel) to the direction of motion in the arrow directions 26. The device components shown in the FIGS. 1A through 3 are consequently already visible and described. However, it becomes clear from FIG. 4 where the switch cell 3 as a carriage 25 exhibits only a small width 32, since the spacial requirement could be substantially decreased by a favorable arrangement of all aggregates. Only the attached separating switch 9 with the collection rail connections 10 for the three phases are disposed at the back wall 8 inside of the switch cabinet 2. The switch cell frame 3a is the largest width dimension within the switch cell width 32. The switch cell 3 accepts there the double fuses 13.

The power block 4 (not visible) is disposed below the switch cell 3 and a contactor 6 or, respectively, an over bridge contactor 6,18 as main contactor is arranged in front of the power block 4 (compare also FIG. 1A, FIG. 1B and FIG. 2). The switching cell 3 is here furnished as a carriage 25 and has the wheel pairs 25a and 25b. Conventional switch cabinets can be modified by the present Invention and now be built with up to 50 percent space savings.

The switch cabinet 2 is overviewed from the outside in FIG. 5, wherein the collection rail connections 10 of the current supply protrude toward the right hand side. Furthermore the shaft 34 for the actuation of the separating switch 9 (disposed in the interior according to FIG. 3) is led to the outside and can be activated from there. The shaft 35 for the ground switch 12 is led similarly toward the outside and can also be activated from there. A safety device against unintentional closing of the separating switch 9 by way of the insulating material plate 9a (FIG. 3) is furnished by having the insulating material plate 9a running through the slot 36 and slid between the open contacts of the separating switch 9. A switch knife 9b in closed position is drawn in FIG. 3 with dash-dotted lines. The region of the separating switch 9 forms a low voltage chamber NS. The chamber NS is hermetically separated by sheet metal walls from the region of a medium voltage chamber MS for receiving the control, that is separated by an intermediate cover. The medium voltage chamber MS serves for receiving the device components belonging to the main current circuit (compare FIG. 1A, FIG. 1B, FIG. 3 and FIG. 4).

The three phase collection rails, which connect the three switch cells 3 to each other, are spatially fixed incorporated running in the upper part of the medium voltage chamber MS behind the low voltage chamber NS, as is shown in FIG. 3 and FIG. 5. The collection rails are guided on the three phase separating switch 9 spatially fixed incorporated at the rear disposed switch cell wall 3a. The ground switch 12 is mounted spatially fixed at the rear wall 8 of the switch cabinet 2 below the separating switch 9. The ground switch 12 is mechanically bolted against the separating switch 9. Consequently the ground switch 12 can only be turned on through an operating lever (shown in FIG. 3) on the shaft 34 at the front side of the switch cabinet 2, if the separating switch 9 is switched off (which means is open and is drawn in full lines). Otherwise, the separating switch 9 can only be switched on, if the ground switch 12 is switched off, that is "is open". The opening of the door in front of the medium voltage chamber MS can also be mechanically bolted. The operator plugs the insulating material plate 9a deep into the switch cell 3 up to into the open contacts of the separating switch 9 through the slot 36 at the front side of the switch cabinet 2 while the state is "switched off". Only after the opening of the separating switch 9, the closing of the ground switch 12 and the insertion of the insulating material plate 9a can the operator open the door to the middle voltage chamber MS. These mechanical boltings assure for the operator that no erroneous operations are generated. The state is also assured by the visual and secure separating distance of the collection rails leading to the voltage, by the grounded states of the device components in the middle voltage chamber MS of the switch cell 3 below the separating switch 9.

LIST OF REFERENCE CHARACTERS 1 three phase current motor
1a three phase motor line
2 switch cabinet (wall)
3 switch cell
3a switch cell wall
3b rear wall for the power electronics
4 power block
5 power electronic
6 over bridge contactor
7 frame
8 rear or side wall of the switching cabinet
9 separating switch
9a insulating material plate
9b switch knife
10 collection rail connection
10a contact coupling
11 (capacitative) voltage display
12 grounding switch 13 fuse, individually or double
14 over voltage charge eliminator
15 voltage sensor
16 thyristors (high power thyristors)
17 aluminum cooling body
18 main contactor
21 switch cell for blind current compensation
22 capacitor
23 current sensor
24 grounding bolt
25 carriage (with frame)
25a wheel pair
25b wheel pair
26 arrow directions
27 current rail for the motor connection
28 support insulator
29 electronic controls for the thyristors
30 protective circuit for the thyristors
31 disengageable contact screw connection
32 movable carriage width
33 traverse
34 shaft for separating switch
35 shaft for grounding switch
36 slot for insulating material plate
NS low voltage chamber
MS medium voltage chamber

The invention claimed is:

1. Arrangement for the control of a soft start or a soft finish of a three phase current motor (1), so called soft starter which arrangement is pre-connected for the starting of heavy mechanical, electrical, or hydraulic drives, wherein individual device groups of a power block (4) with thyristors (16), a power electronic (5) as well as with contactor are together installed in a switch cabinet (2), wherein at least one switch cell (3) is formed in the switch cabinet (2), which switch cell (3) comprises at least the three phase power block (4), the associated power electronic (5) as well as the required contactors, and in a frame (7) with surrounding switch cell walls (9b) and an attachment of support insulators (28) running in the mounting direction (26), wherein the support insulators (28) as a unit are furnished easily demountable from the front and in reverse incorporatable and without attachment at a rear or side wall (8) of the switch cabinet (2) and that in contrast a separating switch (9) attached at the switch cabinet wall (2) and connectable upon insertion or disengageable upon removal with a collection rail connection (10) by way of a pluggable contact coupling (10a).

2. Arrangement according to claim 1, wherein
additionally a main contactor (18) and a disengageable contact screw connection (31) are furnished in the frame (7) of the switch cell (3).

3. Arrangement according to claim 1, wherein
in the frame (7) of the switch cell (3) additionally in the three phase motor lines (1a) there are disposed individual or double fuses (13), over voltage charge eliminators (14) and voltage sensors (15) and/or current sensors (23) and that in each case a collection rail connection (10) attached at the switch cabinet wall (2) is connectable or disengageable by way of a second pluggable contact coupling (10a).

4. Arrangement according to claim 1, wherein
at least the power electronic (5) is disposed in a carriage (25) movable into and out of the switch cabinet (2) and in such case the power block (4) is held in a spatially fixed position.

5. Arrangement according to claim 1, wherein
the power block (4) is disposed in addition to the power electronic (5) in an operating distance on a carriage (25).

6. Arrangement according to claim 4, wherein
at least the rear wall (3b) of the carriage (25) for the power electronic (5) is formed out of glass fiber reinforced plastic.

7. Arrangement according to claim 4, wherein
a closed insulating casing for each phase is formed in the carriage frame (25) for the power electronic (5) and for the power block (4) and that a current rail (27) for the connection of the external motor lines runs outside of this casing and is attached by way of support insulators (28) at the rear switch cabinet wall (2).

8. Arrangement according to claim 1, wherein
a double fuse (13) is connected between the removable insulating material plate (9a) and open contacts of the separating switch (9) and a following grid contactor for each phase.

9. Arrangement according to claim 1, wherein
a grounding bolt (24) is connected in front of the output of the three phase line (1a) from the insulated casing.

10. Arrangement according to claim 1, wherein
the power block (4) is connected in the lower region with an over bridge contactor (6) and in the upper region with a main contactor (18).

11. Arrangement according to claim 1, wherein
a disengageable contact screw connection (31) is furnished at the power block (4) for a capacitor (22).

12. Arrangement according to claim 1, wherein
an over bridge contactor (6) is connected in each case to aluminum cooling bodies (17) of the power electronic (5) by way of copper current rails guiding the electrical main current, which aluminum cooling bodies (17) are connectable to the current rail (27) for the motor connection through the contact coupling (10a).

13. Arrangement according to claim 1, wherein
the separating switch (9) is actuable by way of a first shaft (34) and a grounding switch (12) is also actuable by way of a second shaft (35) from the outside of the switch cabinet (2).

14. Arrangement according to claim 12, wherein
a door of a middle voltage chamber (MS) is openable while the separating switch (9) is open, and while a grounding switch (12) is closed, and while an insulating material plate (9a) is inserted.

* * * * *